United States Patent [19]

Oyamada

[11] Patent Number: 4,641,370
[45] Date of Patent: Feb. 3, 1987

[54] HOUSING ASSEMBLY FOR PORTABLE RADIO APPARATUS WITH ONE-PIECE BASEPLATE AND BATTERY CONTAINER

[75] Inventor: Takashi Oyamada, Tokyo, Japan

[73] Assignee: NEC Corporation, Tokyo, Japan

[21] Appl. No.: 885,734

[22] Filed: Jul. 21, 1986

Related U.S. Application Data

[63] Continuation of Ser. No. 571,270, Jan. 16, 1984, abandoned.

[30] Foreign Application Priority Data

Jan. 18, 1983 [JP] Japan ............................ 58-4952[U]
Apr. 27, 1983 [JP] Japan ............................ 58-63429[U]
May 13, 1983 [JP] Japan ............................ 58-71231[U]

[51] Int. Cl.⁴ ............................................. H04B 1/08
[52] U.S. Cl. ................................. 455/348; 455/351; 455/90; 361/399; 361/422
[58] Field of Search ..................... 455/347–349, 455/351, 89, 90, 128; 361/399, 395, 422

[56] References Cited

U.S. PATENT DOCUMENTS

| | | | |
|---|---|---|---|
| D. 196,679 | 10/1963 | Schaffer ........................ | D14/69 |
| 2,521,423 | 9/1950 | Stuck ............................. | 455/347 |
| 2,810,068 | 10/1957 | Weisz et al. .................... | 455/128 |
| 2,924,705 | 2/1960 | Jones ............................. | 455/351 |
| 3,094,663 | 6/1963 | Siegel ............................ | 455/347 |
| 3,115,635 | 12/1963 | Leeming, Jr. et al. ......... | 455/349 |
| 3,748,583 | 7/1973 | Andersen et al. .............. | 455/351 |
| 4,126,863 | 11/1978 | Kolwaite ....................... | 455/351 |
| 4,194,157 | 3/1980 | Uno ............................... | 455/351 |
| 4,257,121 | 3/1981 | Henderson et al. ............ | 455/351 |
| 4,299,344 | 11/1981 | Yamashita et al. ............. | 455/351 |
| 4,325,142 | 4/1982 | Nakazawa ..................... | 455/351 |
| 4,377,003 | 3/1983 | Abe et al. ...................... | 455/351 |

Primary Examiner—Jin F. Ng
Attorney, Agent, or Firm—Sughrue, Mion, Zinn, Macpeak & Seas

[57] ABSTRACT

A housing structure for a portable radio is composed of a hollow housing section with an open bottom, a base section dimensioned to mate with and close the bottom of the housing section and a printed circuit board mounted on the base section through a locking mechanism. The base section also includes a section for receiving a battery. A removable cover, releaseably locked to the housing section, covers the battery receiving section. Contacts electrically interconnect the battery in the battery receiving section with the printed circuit board, making the radio operable without mating the base section with the housing section. The base section may be provided with a bottom casing portion for storing optional elements such as a vibrator or antenna. A holder structure with a notch for a battery may be either removably or integrally attached to the housing section. The removable holder structure is configured to permit insertion and removal of a battery while the holder structure is engaging the housing section.

29 Claims, 27 Drawing Figures

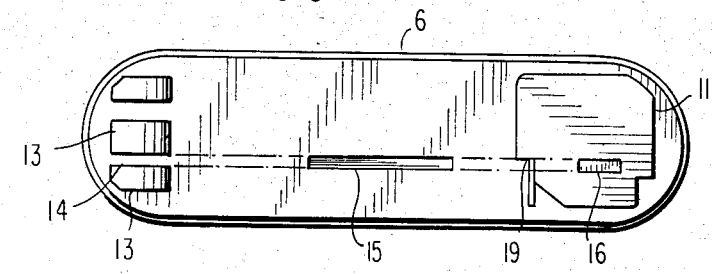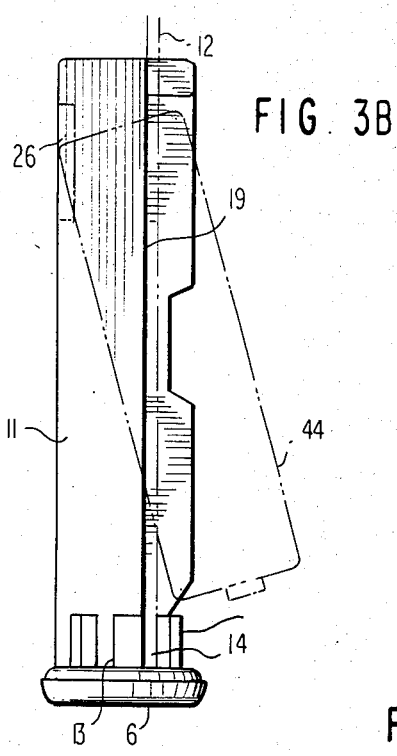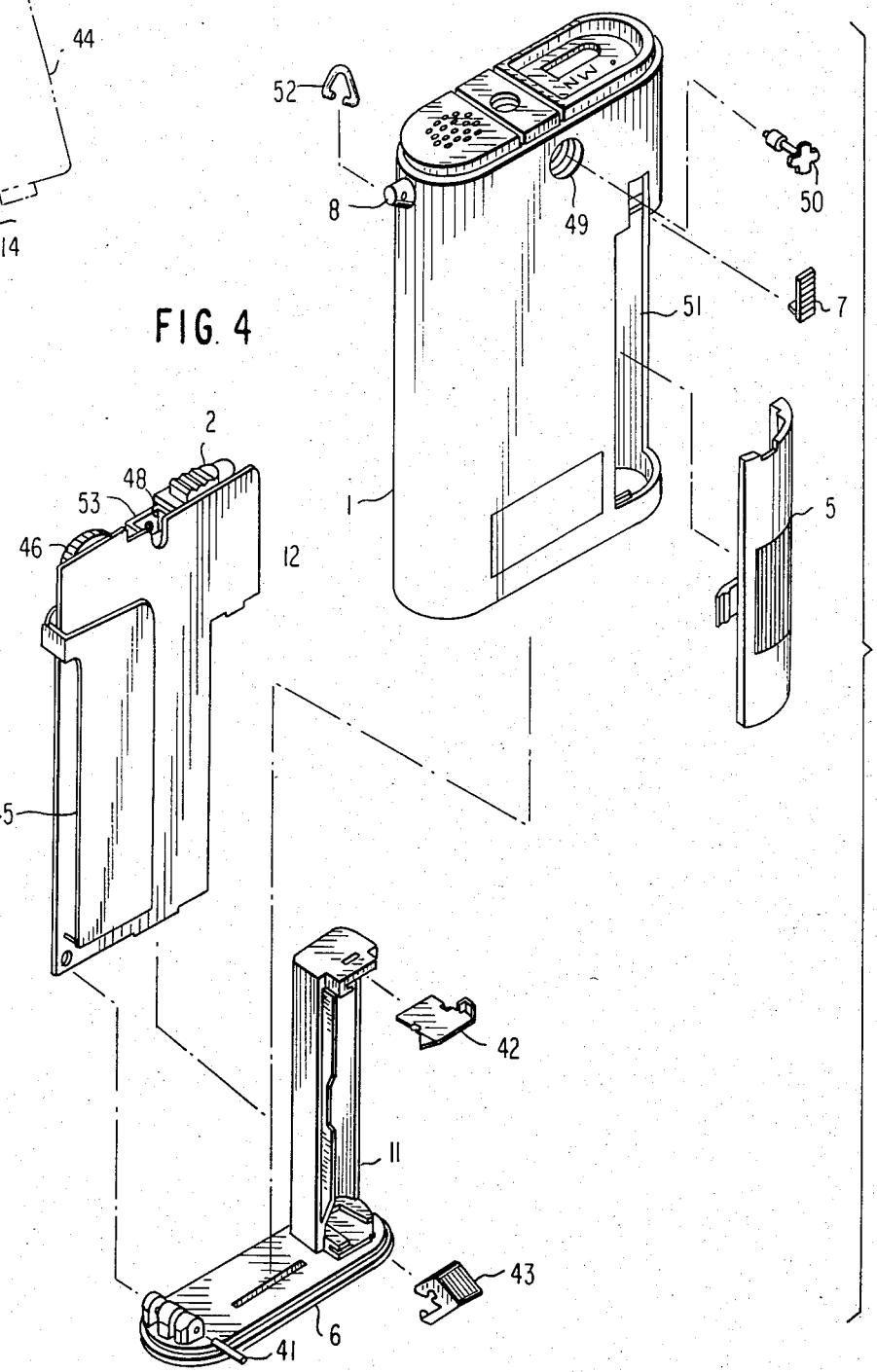

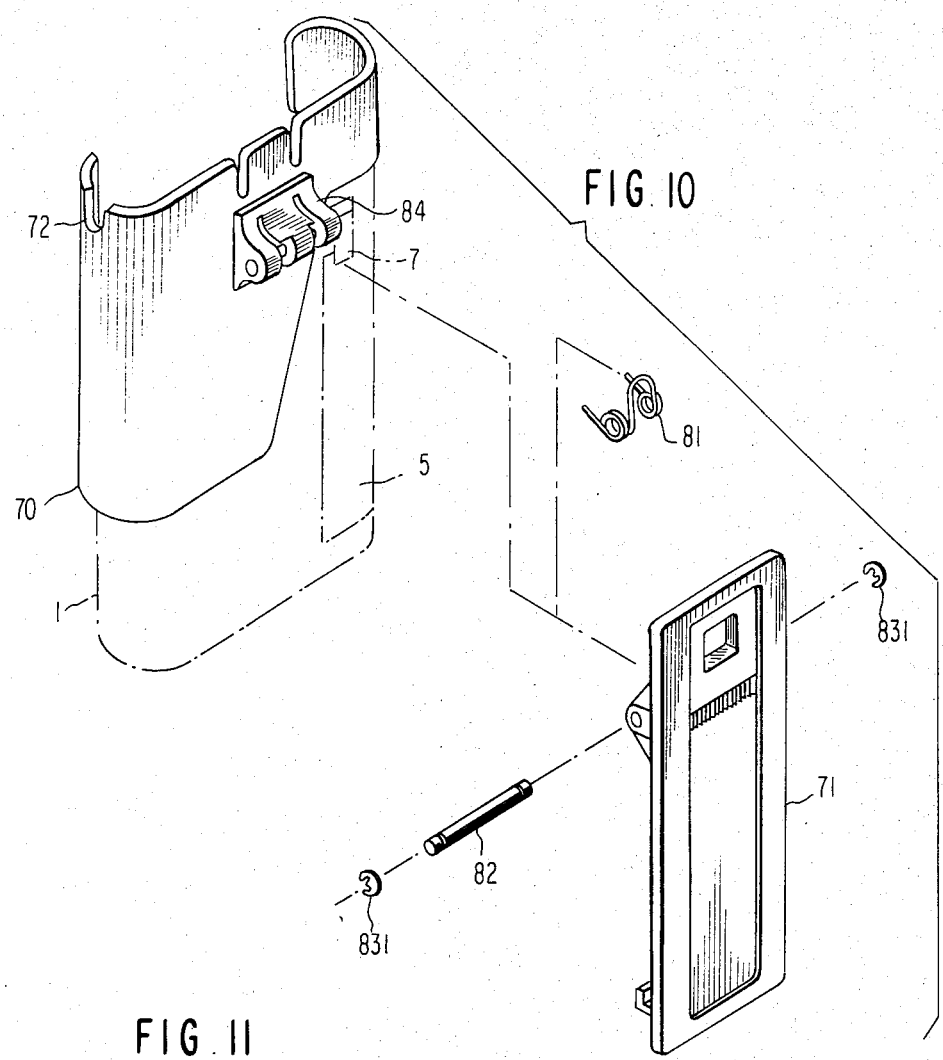
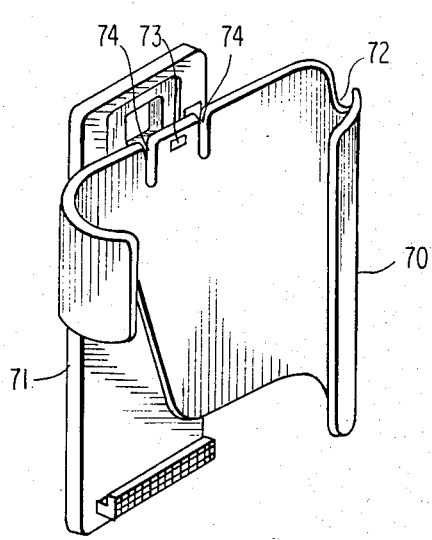
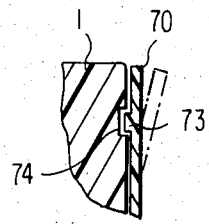

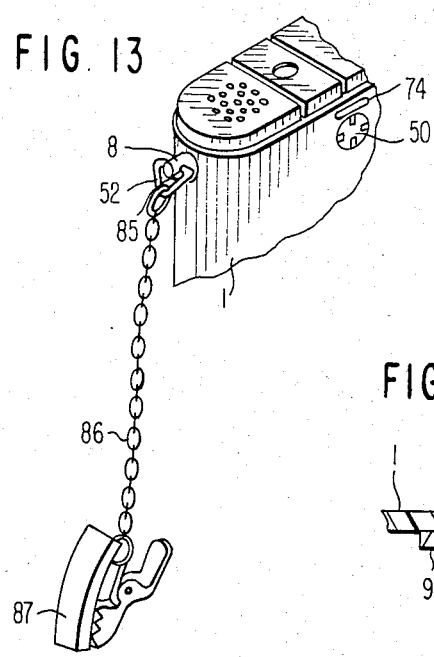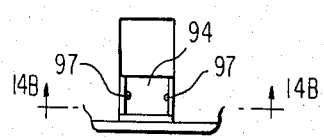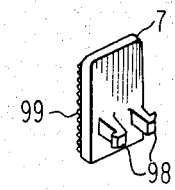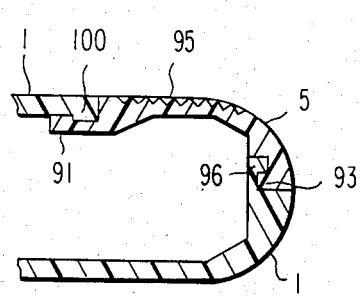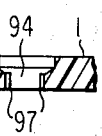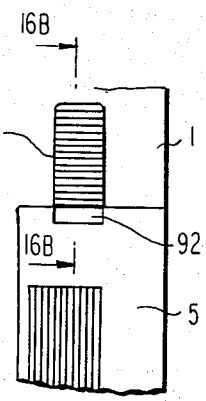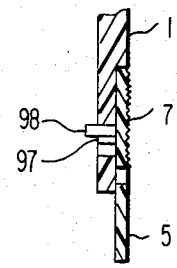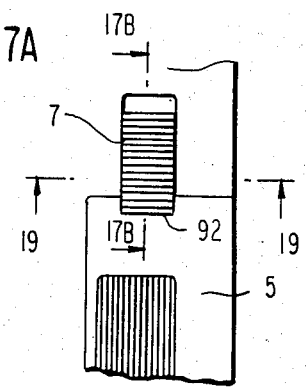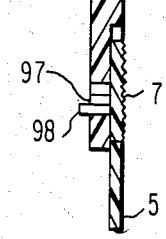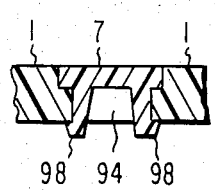

HOUSING ASSEMBLY FOR PORTABLE RADIO APPARATUS WITH ONE-PIECE BASEPLATE AND BATTERY CONTAINER

This is a continuation of application Ser. No. 571,270, filed Jan. 16, 1984, now abandoned.

BACKGROUND OF THE INVENTION

The present invention relates to a housing structure for a portable radio apparatus such as a paging receiver.

Radio apparatuses of the kind described are usually powered by batteries. In such an apparatus, it has been customary to provide a battery containing section which is fixed to a printed circuit board or printed wiring board. The printed circuit board is molded in the frame member of a housing for the apparatus. Then, the frame member is covered by a cover. It is therefore difficult to replace the printed circuit board or circuit elements thereon or to perform the inspection or maintenance of the radio apparatus.

In conventional portable radio apparatuses, any change in the specification such as addition of an antenna, vibrator or like optional part has been coped with by preparing different kinds of housings each corresponding to a particular optional part configuration. Usually, housings for portable radio apparatuses are formed by molding plastics in order to implement quantity production with a compact and lightweight design. Therefore, such different kinds of housings require different kinds of molds, which increase the production costs.

While a prior art radio apparatus is provided with a clip which is directly mounted on a housing to allow it to be carried on a belt or the like, the clip is rather cumbersome when the apparatus is used in a bag or the like.

SUMMARY OF THE INVENTION

It is therefore an object of the present invention to provide a housing structure for a portable radio apparatus which is simple and easy to inspect and maintain.

It is another object of the present invention to provide a housing structure for a portable radio apparatus which has a base plate and a battery container molded integrally with each other.

It is further object of the present invention to provide a housing structure for a portable radio apparatus which is capable of firmly fixing a printed circuit board to an integral base plate and battery container.

It is still another object of the present invention to provide a housing structure for a portable radio apparatus which allows an optional part to be accommodated merely by replacing an integrally molded base plate and battery container.

It is another object of the present invention to provide a holder for a portable radio apparatus which is capable of holding a housing of the apparatus regardless of a change in the volume of a housing bottom portion.

It is yet another object of the present invention to provide a holder for a portable radio apparatus which may be furnished with a same function as a housing with a clip whenever desired.

It is another object of the present invention to provide a housing structure for a portable radio apparatus which applies to both a holder with a clip and a clip with a chain.

It is further object of the present invention to provide a mechanism for preventing a cover for a battery container of a portable radio apparatus from slipping off the battery container.

In accordance with one aspect of the present invention, there is provided a housing structure for a portable radio apparatus, comprising a housing which is open at a bottom thereof and has a volume for accommodating the radio apparatus, a base section dimensioned to close the open bottom of the housing, a battery container section molded integrally with the base section for containing a battery for the radio apparatus, a printed circuit board on which the radio apparatus is mounted, the board having a contour which conforms to the integrally molded base section and the battery container section, and a locking mechanism for locking the printed circuit board to the base section and the battery container section.

BRIEF DESCRIPTION OF THE DRAWINGS

The above and other objects, features and advantages of the present invention will become more apparent from the following description taken with the accompanying drawings in which:

FIGS. 3A-3C are a front view, a side view and a plan view respectively of a base plate and a battery container of the housing shown in FIG. 1;

FIG. 4 is an exploded perspective view of the housing shown in FIG. 1;

FIG. 10 is an exploded perspective view of the holder shown in FIG. 9;

FIG. 11 is a perspective view of the holder of FIG. 9 as viewed from the front;

FIG. 12 is a fragmentary section of the holder of FIG. 9;

FIG. 13 is a fragmentary perspective view showing a relationship between a housing and a chain clip in accordance with the present invention;

FIGS. 14A and 14B are a plan view of a battery cover and an opening for coupling a lock knob of a mechanism for preventing separation of the battery cover in accordance with the present invention, and a section along line 14B—14B thereof, respectively;

FIG. 14C is a perspective view of the lock knob to be engaged in the opening shown in FIGS. 14A and 14B;

FIG. 15 is a section showing interengagement of a battery cover and a housing in the mechanism shown in FIG. 4 or 7;

FIGS. 16A and 16B are a plan view and a sectional side elevational view respectively of the lock knob in an unlocked position in the mechanism of FIG. 4 or 7;

FIGS. 17A and 17B are a plan view and a sectional side elevational view respectively of the lock knob in a locked position in the mechanism of FIG. 4 or 7;

FIG. 19 is a section along line 19—19 of FIG. 17A.

DETAILED DESCRIPTION OF THE PREFERRED EMBODIMENTS

Figure 1:
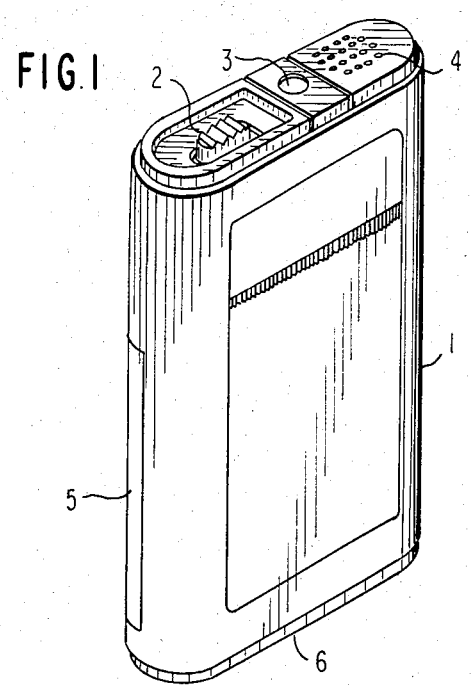
FIG. 1 is a perspective view of a housing of a portable paging receiver to which the present invention is applied, as seen from the front.
Figure 2:
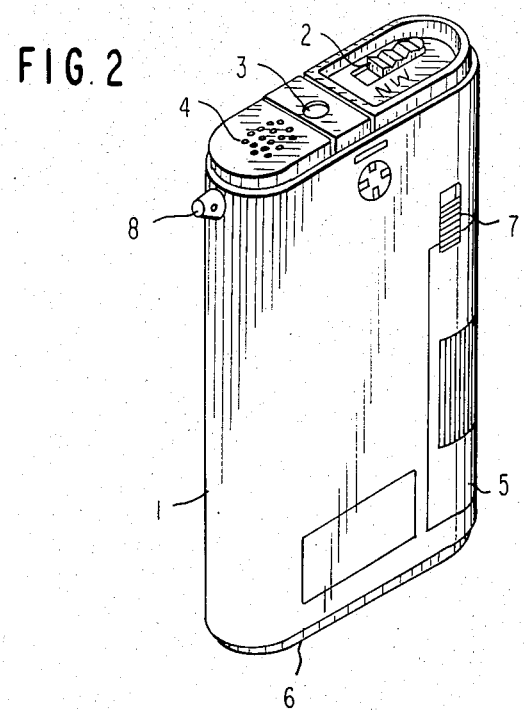
FIG. 2 is a perspective view of the housing of FIG. 1 as seen from the back.

Referring to FIG. 1, a paging receiver or pager 1 has a portable size and, when called up, notifies the call to the bearer of the pager by passing sound through holes 4 for a loudspeaker (not shown) and/or flashing a light emitting diode (LED) 3. The sound from the loudspeaker and flashing of the LED 3 are reset by a switch 2. As shown in FIG. 2, a battery door or cover 5 is positioned at the back of the housing 1 and prevented from slipping off the housing 1 by a locking knob 7, which will be described. As will be discussed later in detail, a base or bottom plate 6 is detachable from the housing 1. A boss 8 protrudes from the housing 1 so that a chain with a clip may be attached thereto, as will also be described.

Figure 3A:
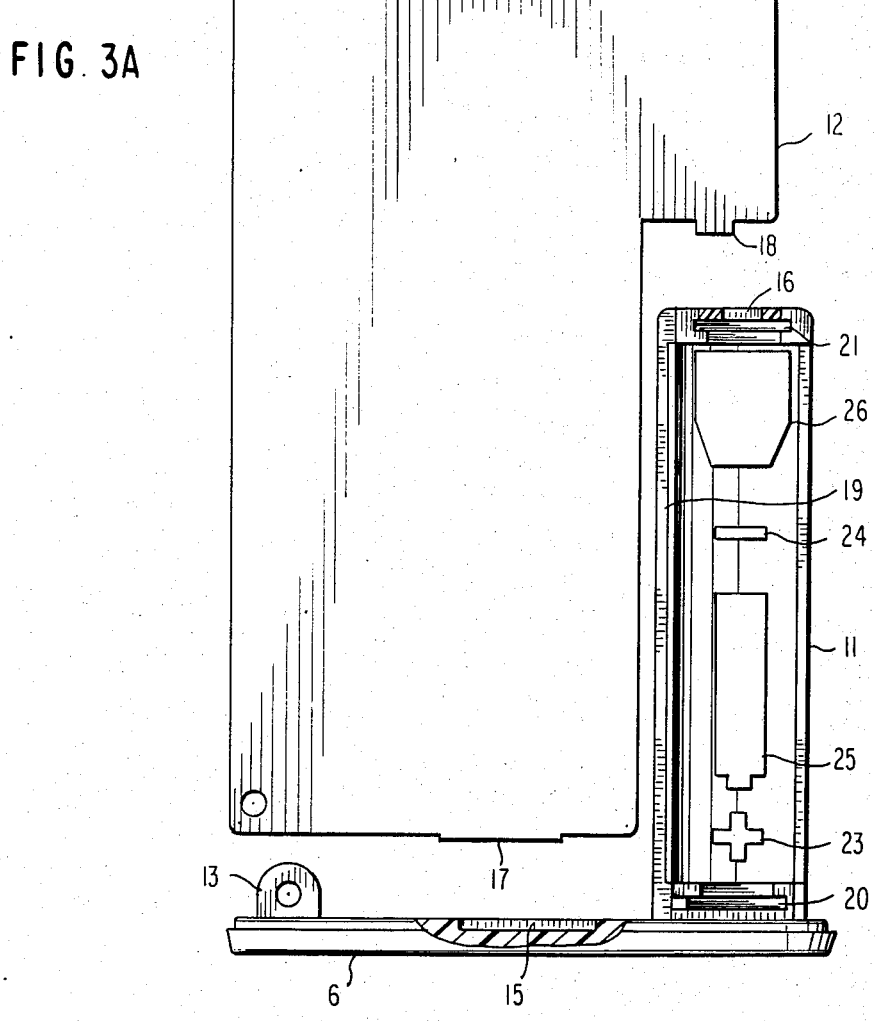

As shown in FIG. 3A, the base plate 6 of the housing 1 has a battery container section 11 molded integrally therewith. Also molded integrally with the base plate 6 is a projection 13 adapted to fix a printed circuit board 12 in position. The projection 13, as best shown in FIG. 3C, includes a recess or groove 14 so as to retain the printed circuit board 12 from opposite sides. For further restraint on the printed circuit board 12, use is made of a spring pin. Additional restraint on the printed circuit board 12 is effected by a recess 15, an opening 16, and a shoulder 19. That is, the printed circuit board has tabs 17 and 18 which are shaped to be received in the recess 15 and the opening 16, respectively. The shoulder 19 is shaped and arranged such that an edge portion of the board 12 bears there-against. In this manner, the tabs 17 and 18 of the board 12 and the projection 13, recess 15, opening 16 and shoulder 19 constitute a locking mechanism in combination, which allows the board 12 to be firmly fixed to the integral molding of the battery container 11 and base plate 6.

The recesses 20 and 21 respectively serve to receive contacts for the positive and negative terminals of a battery. A positive terminal mark 23, a negative terminal mark 24 and a battery mark 25 are formed by locally cutting away the battery container 11 during molding of the container. The marks 23-25 will enable any person to replace a battery without wrongly positioning it. A opening 26 is formed through the battery container section 11 to facilitate loading and unloading of a battery 44, as shown in FIG. 3B. The removed portions 23-26, besides the stated function, contribute to the construction of a lightweight housing. The positive and negative contacts received in the grooves 20 and 21 are individually connected to parts on the printed circuit board 12 by soldering, adding to the rigidly of the interconnection between the board 12 and the battery container 11.

In FIG. 4, the printed circuit board 12 is inserted into the housing 1 from below after being assembled integrally with the base plate 6 and battery container 11. The integration of the printed circuit board 12, base plate and battery container 11 is attained by mating the grooves and holes with the printed circuit board and its tabs as previously stated, and then fastening them together by means of a spring pin 41. An antenna 45 is provided which comprises a flat metal piece and is connected to the printed circuit board 12 by a socket (not shown). Contacts 42 and 43 for the battery 44 are respectively received in the opposite ends of the battery container 11. The switch 2 and a loudspeaker 46 are individually located in predetermined positions.

Figure 5:
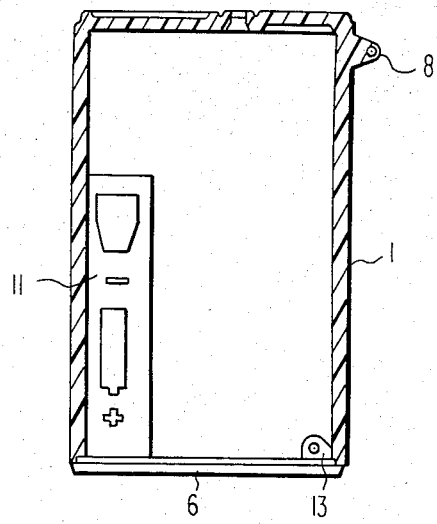
FIG. 5 is a sectional front elevational view of the housing shown in FIG. 1.

The upper edge of the printed circuit board 12 is formed with a notch 48 in a position corresponding to a bore 49 which is formed in the housing 1. A metal retainer 53 formed with a female thread is rigidly fit on the board 12 in alignment with the notch 48. After the insertion of the board 12 into the housing 1, a screw 50 is threaded through the bore 49 of the housing 1 into the retainer 53. The housing 1 is provided with an opening 51 in a position of its side portion which corresponds to the battery container 11. The battery cover 5 is adapted to close the opening 51. Formed in the top of the housing 1 are an opening for the switch 2, an opening for the LED 3, and holes for the loudspeaker 46. A metal fitting 52 for locking a chain with a clip, which will be described, is engaged with the boss 8. The pager housing assembled in the manner described is shown in FIG. 5.

As described above, the printed circuit board 12 is fixed to the integral molding of the battery container 11 and base plate 6, desired parts are loaded on the board 12, the resulting assembly is inserted into the housing 1, and then it is fastened to it by means of the screw 50. Hence, the mounted electrical parts can operate as a pager even before the insertion thereof into the housing or after removal therefrom, which is effected by removing the screw 50, thereby facilitating inspection, maintenance and like services. Meanwhile, before the contacts for the battery are soldered to the printed circuit board 12, the latter can be readily detached from the base plate 6 and battery container 11 merely by pulling out the spring pin 41. This allows a vibrator, a ferrite antenna and other optional parts to be additionally mounted with ease on the board 12.

Figure 6:
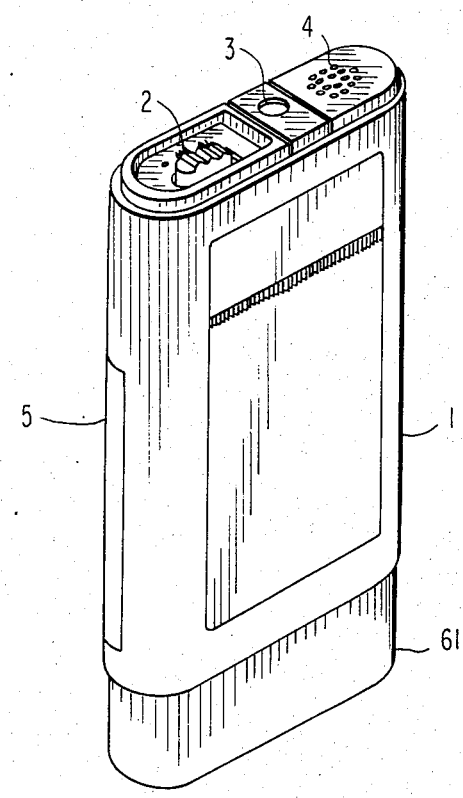
FIG. 6 is a perspective view of a housing of another paging receiver to which the present invention is applied.
Figure 7:
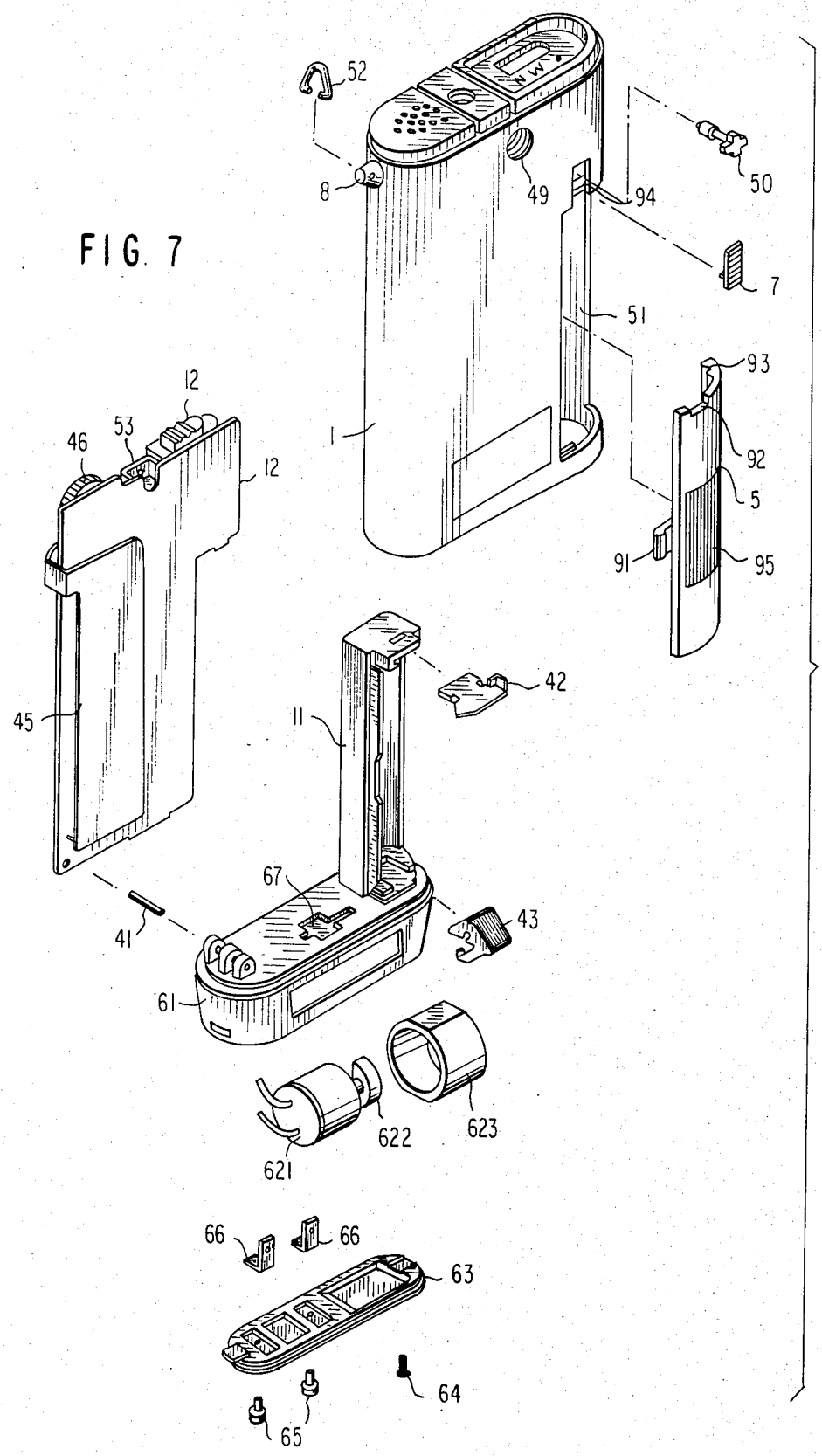
FIG. 7 is an exploded perspective view of a bottom casing and a battery container of the housing shown in FIG. 6.
Figure 8A:
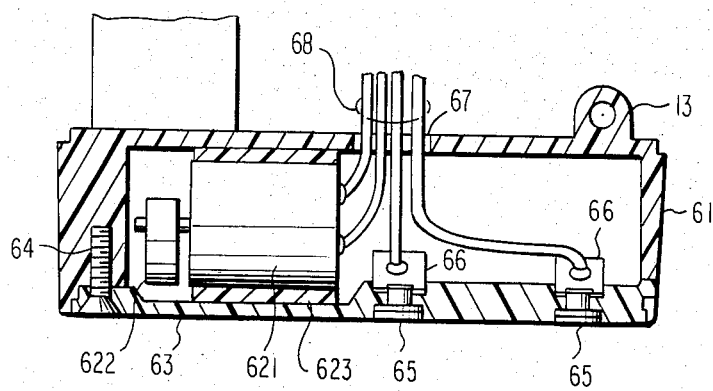
FIGS. 8A and 8B are respectively a section of the bottom casing of the housing shown in FIGS. 6 and 7 and a rear end view thereof with a bottom lid removed.
Figure 8B:
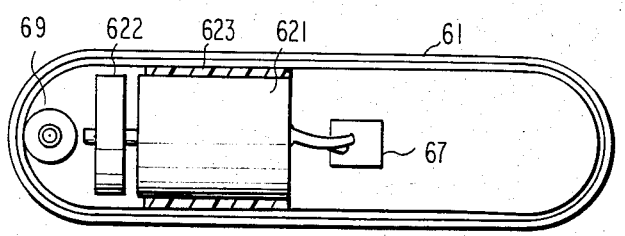

A structure in accordance with the present invention which accommodates optional parts will be now described. In FIG. 6, an optional part is contained in a bottom casing 61 which replaces the base plate and extends in the lengthwise direction of the housing 1. As shown in FIG. 7, the illustrated bottom casing 61 accommodates therein a vibrator made up of a motor 621 and a vibrator element 622, by way of example. The vibrator assembly is enclosed by a cushion 623. The bottom of the casing 61 is closed by a closure member or lid 63 which is fastened thereto by a boss 69 (See FIG. 8B) and a screw 64. The construction is common to the construction of FIGS. 1 to 5 except for the bottom casing 61. External terminals 65 are fastened to terminal fittings 66 to serve as battery charging terminals. In FIGS. 8A and 8B, leads 68 extending from the metal fittings 66 and vibrator motor 621 are passed through an opening 67 formed through the casing 61 to extend to the printed circuit board 12. It is also possible to store in the casing 61 any other optional part such as a ferrite antenna, which may replace the flat antenna 45, or one which is in excess of the capacity of the board 12.

In this manner, optional parts can be mounted simply by replacing the base plate with the bottom casing, that is, without recourse to any modification to the molded configuration of the housing 1. Generally molding of the housing 1 involves adjustment of the interengagement of the opening 51 of the battery container 11 and the battery cover 5 and, hence, it requires costly metal molds and thereby high production costs. In this respect, the common use a metal mold achievable with the construction shown in FIGS. 6 to 8B profits both manufacturers and users.

Figure 9:
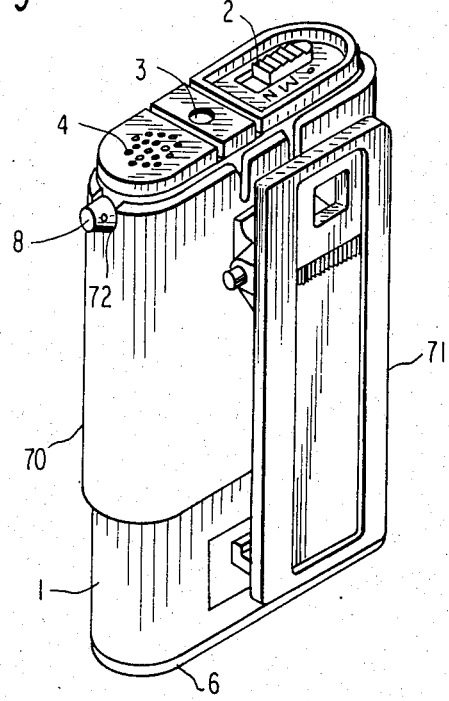
FIG. 9 is perspective view of a holder in accordance with the present invention as viewed from the back.

Referring to FIG. 9, a holder 70 matches in configuration with both the base plate 6 and the bottom casing 61 previously mentioned. The holder 70 will be employed when a butterfly type clip is to be attached to the housing 1 and not when a simple clip is desired. To allow the bearer the choice, the holder 70 is constructed to be readily attached to and detached from the housing 1, as will be described later in detail.

The holder 70 is a mount made of a sheet molded in conformity to the contour of the housing 1 and has a generally U-shaped cross-section. It may be formed by molding a plastic, for example. A clip 71 capable of butterfly type opening and closing actions is mounted on the back of the holder 70. As best shown in FIG. 10, the clip 71 is connected to a clip support 84 using E-rings 831 and a pin 82 and through a spring 81. One side portion of the holder 70 is notched as at 72 in order to engage with the boss 8 of the housing 1. A substantial area of the skirt portion of the holder 70 is notched aslant so that the battery may be changed without removing the holder 70. This notch is dimensioned to accommodate the movement of the battery cover 5 and that of the lock knob 7 which are indicated by dash-and-dots lines in FIG. 10.

In FIG. 11, the holder 70 is formed with a projection 73 and slots 74 in a front upper portion thereof. As shown in FIG. 12, the projection 73 is engagable in a recess 74 formed in the housing 1, while the slots 74 enable the part of the holder 70 including the projection 73 to flex relative to the rest of the holder 70. As indicated by a dots-and-dash line in FIG. 12, the flexure of the projection portion facilitates attachment and detachment of the housing 1 to and from the holder 70. The flexure, coupled with the engagement of the projection 73 with the recess 74, increases the restraint exerted by the holder 70 on the housing 1.

In FIG. 13, the boss 8 is formed with a hole 85 for receiving the metal fitting 52 which is adapted to retain a chain 86 with a clip 87. The chain clip 87 may be used when the housing 1 is outside the holder 70, for example.

Figure 18A:
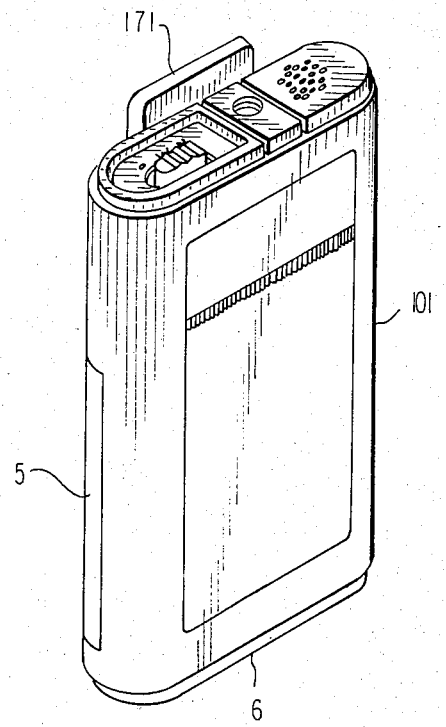
FIGS. 18A and 18B are a perspective view and an exploded perspective view respectively of a clip directly mounted on a housing of a portable radio apparatus in accordance with the present invention.
Figure 18B:
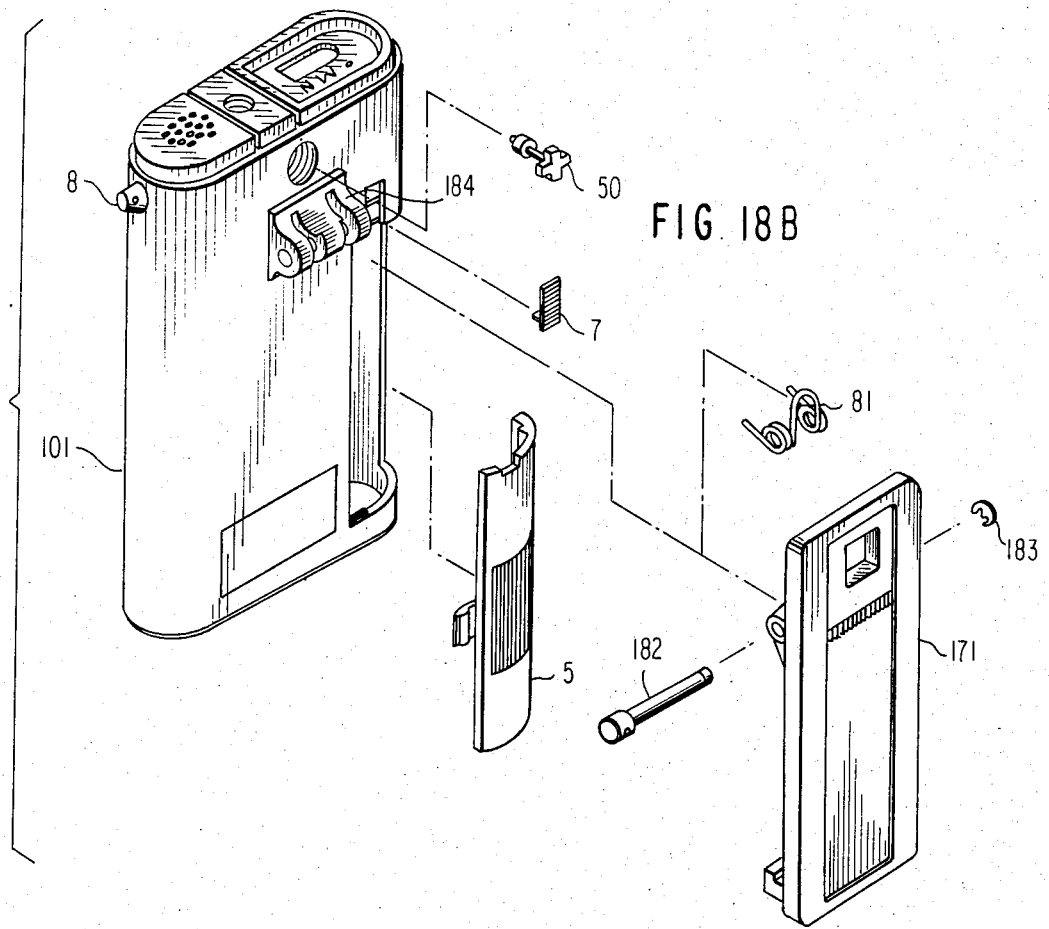

In the above construction, sliding the receiver housing 1 from above into the holder 70 sets up the configuration shown in FIG. 9, which is equivalent in effect to a construction shown in FIGS. 18A and 18B having a clip directly mounted on a receiver housing. The use of the chain clip 87 only is readily implemented by pulling the housing 1 upwardly out of the holder 70. The force required in this instance is adjustable by adjusting the depth of interengagement of the recess 74 in the housing 1 and the projection 73 on the holder 70. Resiliency of the holder 70 itself and the interengagement of the projection 73 and recess 74 cooperate to prevent the housing 1 from slipping upwardly out of the holder 70, while the boss 8 for the chain clip 87 and the notch 72 of the holder 70 cooperate to prevent it from slipping downwardly out of the holder 70.

Referring again to FIG. 7, the battery cover 5 is slid sideways into the housing 1 and locked in position when a latch member 91 thereof fully rides across a projection 100 (FIG. 15), which is formed inside the housing 1. At the same time, an engaging portion 93 at the side of the battery cover 5 is coupled with an engaging portion 96 of the housing 1. To remove the battery cover 5 from the housing 1, it is slid sideways in the opposite direction to the aforementioned by depressing a knurled portion 95 of the cover 5 by finger.

After the battery cover 5 is locked to the housing 1, the lock knob 7 is slid into engagement with a notch 92 of the cover 5 to prevent separation of the cover 5. As shown in FIG. 14C, the lock knob has a knurled portion 99 and hook-shaped tongues 98. The tongues 98 are coupled into an opening 94 as shown in FIG. 19, thereby securing the knob 7 to the housing 1. As shown in FIGS. 14A and 14B, the opening 94 has two lugs 97 thereinside. Due to the lugs 97 and to the resiliency of tongues 98, the lock knob 7 selectively locks the battery cover 5 and unlocks it.

The locking and unlocking mechanism associated with the knob 7 will be now described with reference to FIGS. 16A-17B. In the position shown in FIGS. 16A and 16B, the lock knob 7 remains in an upper portion of the drawing disengaged from the cover 5; the cover 5 may be removed from the housing 1 by the previously discussed procedure. In the position of FIGS. 17A and 17B, on the other hand, the knob 7 is in a lower portion of the drawing where it is engaged with a notch 92 of the cover 5. In such a position, the cover 5 is unmovable relative to the housing 1 and, therefore, restrained from separating from the housing 1 although the housing may be subjected to vibrations, shocks and impacts, and physical contacts with external objects in the course of transportion.

In FIGS. 18A and 18B, a receiver housing 101 is shown which has a butterfly clip 171 directly fixed thereto. That is, the clip 171 is fixed to a clip support 184, which is rigid on the housing 101, using a pin 182 and an E-ring 183 and through a spring 81. The rest of the construction is common to that of the previously discussed housing.

What is claimed is:

1. A housing structure for a portable radio apparatus, comprising:
    (a) a housing which is open at the bottom thereof and has a volume for accomodating said radio apparatus;
    (b) a base section dimensioned to close the open bottom of said housing;
    (c) a battery container section for containing a battery for said radio apparatus, said battery container section being molded integrally with said base section forming a part of said base section and transversely positioned with respect to said base section;
    (d) a printed circuit board on which said radio apparatus is mounted, said board having a contour which conforms to said base section and to said battery container section, said base section and said battery container section supporting said board; and
    (e) a locking mechanism for locking said printed circuit board to said base section and to said battery container section.

2. A housing structure as claimed in claim 1, wherein said base section comprises a base plate.

3. A housing structure as claimed in claim 1, wherein said base section comprises a bottom casing for storing an optional part of said radio apparatus.

4. A housing structure as claimed in claim 3, wherein said radio apparatus is a paging receiver, and said optional part is a vibrator.

5. A housing structure as claimed in claim 1, wherein said battery container section includes cut away portions defining a positive terminal mark, a negative terminal mark and a mark in the shape of a battery.

6. A housing structure as claimed in claim 1, wherein said locking mechanism comprises an aperture and at least one tab which are formed in edge portions of said printed circuit board; a projection extending from said base section at a position which corresponds to said aperture; a recess formed in one of said base section and said battery container section to be engagable with said tab; a shoulder formed at least in a portion of a region of said battery container section which is engagable with said printed circuit board; and a pin for interconnecting said projection and said aperture.

7. A housing structure as claimed in claim 1 further comprising holder means for holding said housing.

8. A housing structure as claimed in claim 7, wherein said holder means comprises a butterfly type clip which is directly fixed to a back of said housing.

9. A housing structure as claimed in claim 7, wherein said holder means comprises a generally U-shaped body which is cut away in portions thereof which correspond to an upper portion, a lower portion and a front portion of said housing, thereby allowing said housing to be slid into said holder means; a boss positioned on a side wall of an upper portion of said housing; a notch formed in an upper edge of said U-shaped body in a position for engaging with said boss; and a butterfly type clip mounted on a back of said U-shaped body.

10. A housing structure as claimed in claim 9, wherein said holder means further comprises a notch formed in a portion of said U-shaped body which covers said battery container section, so that a battery is allowed to be inserted into and removed from said battery container section while said holder means holds said housing.

11. A housing structure as claimed in claim 9, wherein said holder means further comprises a projection extending from a surface of said U-shaped body which is engagable with said housing and in the vicinity of said upper open edge; and slots located at both sides of said projection and extending from said upper opening; and said housing includes a recess in which said projection of said U-shaped body is engagable.

12. A housing structure as claimed in claim 9, wherein said boss is formed with an aperture for engaging an accessory therein.

13. A housing structure as claimed in claim 12, wherein said accessory is a chain with a clip.

14. A housing structure as claimed in claim 1 further comprising an opening for loading and unloading said battery; a battery cover slidably engagable with said opening to close said opening; and a battery cover locking mechanism for locking a sliding motion of said battery cover;

said battery cover locking mechanism comprising: a lock knob, a knob opening for receiving said lock knob which is formed in an edge portion of said loading and unloading opening that is perpendicular to a sliding direction of said battery cover; hook-shaped tongues formed on said lock knob for locking said lock knob in said knob opening; and stop lugs extending from edge portions of said knob opening which are perpendicular to a movable direction of said lock knob, said stop lugs cooperating with said hook-shaped tongues to stop said lock knob at a predetermined position.

15. A housing structure for a portable radio apparatus, comprising:
(a) a housing which is open at an end thereof and has a volume for accomodating said radio apparatus;
(b) an end closing member dimensioned to close the open end of said housing;
(c) a battery container section for containing a battery for said radio apparatus, said battery container section being molded integrally with said end closing member forming a part of said end closing member;
(d) a printed circuit board on which said radio apparatus is mounted, said board having a contour which conforms to said end closing member and to said battery container section, said end closing member and said battery container section supporting said board; and
(e) a locking mechanism for locking said printed circuit board to said end closing member and to said battery container section.

16. A housing structure as claimed in claim 15, wherein said end closing member comprises a base plate.

17. A housing structure as claimed in claim 15, wherein said end closing member comprises a bottom casing for storing an optional part of said radio apparatus.

18. A housing structure as claimed in claim 17, where in said radio apparatus is a paging receiver, and said optional part is a vibrator.

19. A housing structure as claimed in claim 15, wherein said battery container section includes cut away portions defining a positive terminal mark, a negative terminal mark and a mark in the shape of a battery.

20. A housing structure as claimed in claim 15, wherein said locking mechanism comprises an aperture and at least one tab which are formed in edge portions of said printed circuit board; a projection extending from said end closing member at a position which corresponds to said aperture; a recess formed in one of said end closing member and said battery container section to be engagable with said tab; a shoulder formed at least in a portion of a region of said battery container section which is engagable with said printed circuit board; and a pin for interconnecting said projection and said aperture;

21. A housing structure as claimed in claim 15 further comprising holder means for holding said housing.

22. A housing structure as claimed in claim 21, wherein said holder means comprises a butterfly type clip which is directly fixed to a back of said housing.

23. A housing structure as claimed in claim 21, wherein said holder means comprises a generally U-shaped body which is cut away in portions thereof which correspond to an upper portion, a lower portion and a front portion of said housing, thereby allowing said housing to be slid into said holder means; a boss positioned on a side wall of an upper portion of said housing; a notch formed in an upper edge of said U-shaped body in a position for engaging with said boss; and a butterfly type clip mounted on a back of said U-shaped body.

24. A housing structure as claimed in claim 23, wherein said holder means further comprises a notch formed in a portion of said U-shaped body which covers said battery container section, so that a battery is allowed to be inserted into and removed from said battery container section while said holder means holds said housing.

25. A housing structure as claimed in claim 23, wherein said holder means further comprises a projection extending from a surface of said U-shaped body which is engagable with said housing and in the vicinity of said upper open edge; and slots located at both sides of said projection and extending from said upper opening; and said housing includes a recess in which said projection of said U-shaped body is engagable.

26. A housing structure as claimed in claim 23, wherein said boss is formed with an aperture for engaging an accessory therein.

27. A housing structure as claimed in claim 26, wherein said accessory is a chain with a clip.

28. A housing structure as claimed in claim 15 further comprising an opening for loading and unloading said battery; a battery cover slidably engagable with said opening to close said opening; and a battery cover locking mechanism for locking a sliding motion of said battery cover.

29. A housing structure as claimed in claim 28, wherein said battery cover locking mechanism comprising: a lock knob, a knob opening for receiving said lock knob which is formed in an edge portion of said loading and unloading opening that is perpendicular to a sliding direction of said battery cover; hook-shaped tongues formed on said lock knob for locking said knob in said knob opening; and stop lugs extending from edge portions of said knob opening which are perpendicular to a movable direction of said lock knob, said stop lugs co-operating with said hook-shaped tongues to stop lock knob at a predetermined position.

* * * * *